United States Patent
Madokoro et al.

(10) Patent No.: US 8,552,397 B2
(45) Date of Patent: Oct. 8, 2013

(54) FOCUSED ION BEAM DEVICE AND FOCUSED ION BEAM PROCESSING METHOD

(75) Inventors: Yuichi Madokoro, Hitachinaka (JP); Hirokazu Kaneoya, Hitachinaka (JP); Tsuyoshi Onishi, Hitachinaka (JP); Isamu Sekihara, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/513,256

(22) PCT Filed: Nov. 15, 2010

(86) PCT No.: PCT/JP2010/006684
§ 371 (c)(1),
(2), (4) Date: Jun. 1, 2012

(87) PCT Pub. No.: WO2011/070727
PCT Pub. Date: Jun. 16, 2011

(65) Prior Publication Data
US 2012/0235055 A1    Sep. 20, 2012

(30) Foreign Application Priority Data
Dec. 8, 2009 (JP) ................... 2009-278104

(51) Int. Cl.
*H01J 3/28* (2006.01)
*G21K 1/00* (2006.01)
(52) U.S. Cl.
CPC ...................... *G21K 1/00* (2013.01)
USPC ..................... 250/396 R; 250/398

(58) Field of Classification Search
CPC ............. G21K 1/00; G21K 1/02; G21K 1/04; G21K 1/08
USPC ............................. 250/398, 396 R
See application file for complete search history.

(56) References Cited

U.S. PATENT DOCUMENTS 4,431,915 A * 2/1984 Nakagawa et al. ........... 250/310
4,710,639 A   12/1987 Sawaragi
(Continued)

FOREIGN PATENT DOCUMENTS

JP    61-240553 A   10/1986
JP     4-62748 A    2/1992
(Continued)

OTHER PUBLICATIONS

International Search Report including English language translation dated Dec. 28, 2010 (Eight (8) pages).

*Primary Examiner* — Robert Kim
*Assistant Examiner* — James Choi
(74) *Attorney, Agent, or Firm* — Crowell & Moring LLP

(57) ABSTRACT

Disclosed is an operation for an optical system which achieves observation of focused ion beam processing equivalent to that in a case wherein a sample stage is tilted mechanically. In a focused ion beam optical system, an aperture, a tilting deflector, a beam scanner, and an objective lens are controlled so as to irradiate an ion beam tilted to the optical axis of the optical system, thereby achieving thin film processing and a cross section processing without accompanying adjustment and operation for a sample stage. The thin film processing and the cross section processing with a focused ion beam can be automated, and yield can be improved. For example, by applying the present invention to a cross section monitor to detect an end point, the cross section processing can be easily automated.

22 Claims, 17 Drawing Sheets

(56) References Cited

U.S. PATENT DOCUMENTS

| | | | |
|---|---|---|---|
| 7,223,983 B2 * | 5/2007 | Kawasaki et al. | 250/398 |
| 7,872,230 B2 * | 1/2011 | Ohnishi | 250/309 |
| 8,227,752 B1 * | 7/2012 | Mantz et al. | 250/306 |
| 2004/0119022 A1 | 6/2004 | Sato et al. | |
| 2006/0033037 A1 | 2/2006 | Kawasaki et al. | |
| 2006/0145087 A1 * | 7/2006 | Parker | 250/396 R |
| 2007/0284536 A1 * | 12/2007 | Frosien | 250/396 R |
| 2008/0283746 A1 | 11/2008 | Ohnishi | |
| 2009/0039257 A1 * | 2/2009 | Essers et al. | 250/307 |
| 2011/0139980 A1 * | 6/2011 | Nakano et al. | 250/307 |

FOREIGN PATENT DOCUMENTS

| | | |
|---|---|---|
| JP | 9-223726 A | 8/1997 |
| JP | 2004-127930 A | 4/2004 |
| JP | 2005-108470 A | 4/2005 |
| JP | 2006-54074 A | 2/2006 |
| JP | 2008-286652 A | 11/2008 |

* cited by examiner

FIG. 18-2
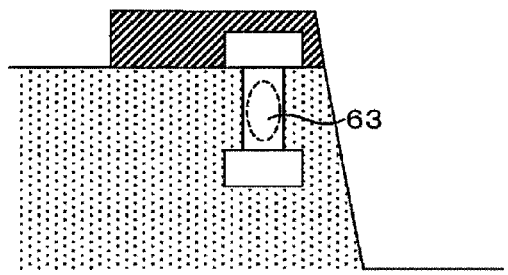
(d)
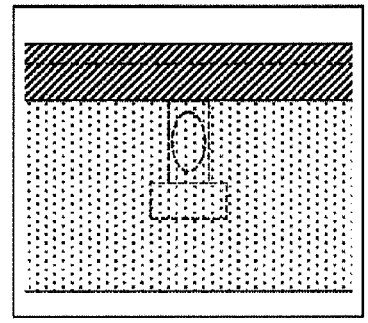
(d´)
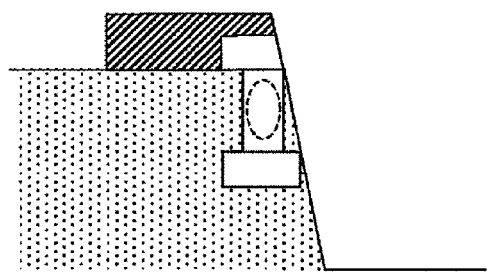
(e)
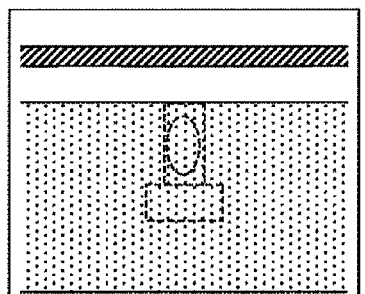
(e´)
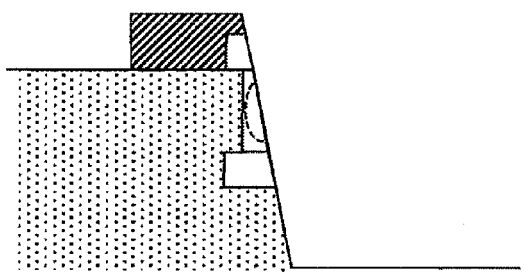
(f)
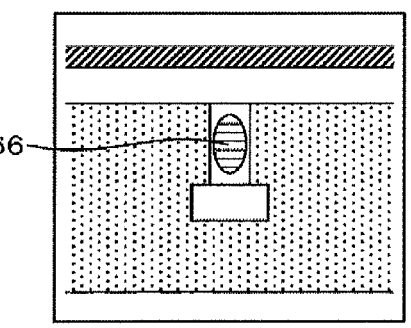
(f´)

FOCUSED ION BEAM DEVICE AND FOCUSED ION BEAM PROCESSING METHOD

TECHNICAL FIELD

The present invention relates to a focused ion beam apparatus.

BACKGROUND ART

For an application of a focused ion beam (FIB) apparatus, a thin film sample having a thickness of 1 μm or less is widely prepared by using a sputtering function and this thin film sample is observed and evaluated by a transmission electron microscope (TEM). JP-A-04-062748 (Patent Literature 1) discloses that when a sample is tilted by a few degrees to perform thin film processing, a thin film sample having a uniform film thickness is prepared. When this technology is used for preparation finish of a thin film sample, TEM observation can be performed over a wide range with high accuracy.

Further, internal structure analysis in which sample cross section processing using a focused ion beam and scanning electron microscope (SEM) observation are combined is widely performed. JP-A-2008-286652 (Patent Literature 2) proposes a method for using as an image a secondary electron signal from a cross section using a focused ion beam or processing beam and observing a processed surface in real time without interrupting FIB processing and sequentially observing a cross section.

JP-A-2004-127930 (Patent Literature 3) discloses that a aperture position on an objective lens is staggered from an optical axis and a beam out of the optical axis is selectively taken in, and further, when a beam is made incident out of the optical axis of the objective lens to cancel an aberration, a chromatic aberration and a coma aberration are cancelled, respectively, and a beam is irradiated on a sample at a tilt angle of 10° or more. This technology is applicable also to a focused ion beam apparatus.

CITATION LIST

Patent Literature

Patent Literature 1: JP-A-04-062748
Patent Literature 2: JP-A-2008-286652
Patent Literature 3: JP-A-2004-127930

SUMMARY OF INVENTION

Technical Problem

As a result of extensive investigations about an application of focused ion beam processing, the present inventors have the following knowledge.

The present inventors have considered that in a focused ion beam application such as thin film sample preparation and cross section observation during cross section processing, since a sample stage is not required to be tilted at a large angle, when a focused ion beam is tilted without tilting the sample stage, sufficient processing can be practically performed.

To solve the above-described problem, although there is concern that beam convergence is reduced through the tilt of a focused ion beam, the present inventors have experimentally studied a method for performing thin film sample preparation or cross section processing by using a tilted focused ion beam. As a result, the present inventors have found that also in the case where a beam passes through out of an optical axis and it is tilted on a sample, when a tilt angle is small at nearly 1°, the nearly same processing shape as that at the time of tilting a sample stage is obtained only by adjusting an objective lens voltage.

However, when a beam tilt function is actually mounted on the focused ion beam device, the control is required to be performed so as to set or adjust a tilt direction or tilt angle of a beam through an operator as well as so as to reproducibly set a beam tilt condition. Further, in the case where the focused ion beam device is used for thin film processing, an adjustment fails to be performed for each processing. Unless the tilted beam is set to be automatically selected, processing efficiency is not improved.

An object of the present invention is to achieve a focused ion beam processing observation through an operation of an optical system in the same manner as in the case of mechanically tilting a sample stage.

Solution to Problem

The present invention relates to control over an aperture in a focused ion beam optical system, a tilting deflector, a beam scanner, and an objective lens, and further irradiation of an ion beam tilted to an optical axis of the optical system.

Advantageous Effects of Invention

According to the present invention, thin film processing or cross section processing can be achieved without an adjustment or operation for a sample stage.

BRIEF DESCRIPTION OF DRAWINGS

FIG. 18-1 is a conceptual diagram illustrating detection of a desired cross section through a cross section observation during processing;

FIG. 18-2 is a conceptual diagram illustrating detection of a desired cross section through a cross section observation during processing;

DESCRIPTION OF EMBODIMENTS

Figure 1:
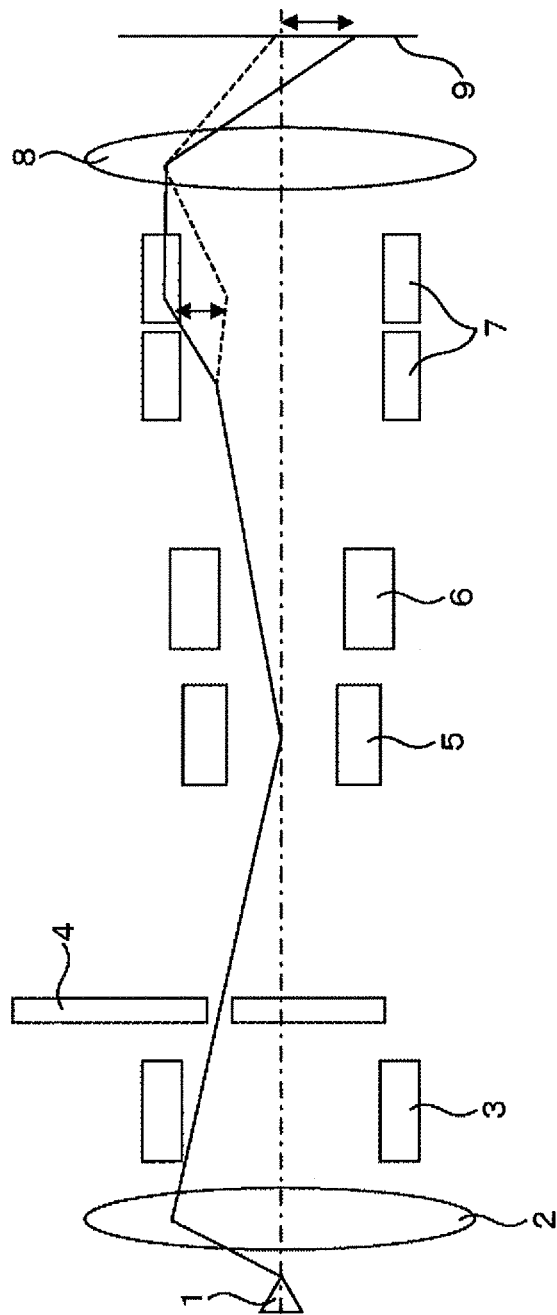
FIG. 1 illustrates an optical system and tilted beam path according to a present embodiment.

In an embodiment, disclosed is a focused ion beam device including a sample stage which mounts a sample, an ion source which discharges an ion beam, a aperture which narrows down the ion beam discharged from the ion source, a tilting deflector which deflects the ion beam passing through the aperture, a beam scanner which scans the ion beam passing through the tilting deflector, an objective lens which irradiates the ion beam passing through the beam scanner on a sample, and a control device which controls the aperture, the tilting deflector, the beam scanner, and the objective lens. Further, disclosed is the focused ion beam device including the control device which allows the aperture to be moved out of an optical axis, the tilting deflector to deflect an ion beam in the same direction as the aperture is moved, the ion beam to pass through out of the optical axis of the objective lens, and the ion beam tilted to the optical axis to be irradiated on a sample.

In the present embodiment, disclosed is the focused ion beam device including the control device which stores a combination of an aperture position, a tilting deflector voltage, an objective lens voltage, and a beam scanner voltage.

In the present embodiment, disclosed is the focused ion beam device including a display device which displays a direction or/and incidence angle of a tilted beam.

In the present embodiment, disclosed is the focused ion beam device in which a convergent point of a lens located upstream of the aperture is set within the tilting deflector.

In the present embodiment, disclosed is the focused ion beam device including the control device which irradiates an ion beam tilted to the optical axis on a sample and prepares a thin film having a nearly uniform film thickness.

In the present embodiment, disclosed is the focused ion beam device including the control device which irradiates an ion beam tilted to the optical axis on a sample and forms a cross section image from a secondary particle signal generated along with cross section processing of the sample.

In the present embodiment, disclosed is the focused ion beam device including the control device which finishes cross section processing in the case where the formed cross section image satisfies a predetermined condition.

In the present embodiment, disclosed is the focused ion beam device including the control device which changes a processing condition in the case where the formed cross section image satisfies a predetermined condition.

In the present embodiment, disclosed is the focused ion beam device including the control device which irradiates an ion beam tilted to the optical axis on a sample and prepares a pillar sample having the nearly same tilt as that of a side surface of the sample.

In the present embodiment, disclosed is the focused ion beam device including the control device which irradiates an ion beam tilted to the optical axis on a micro-sample and fixes the micro-sample and a fixed object by using a deposition film.

In the present embodiment, disclosed is the focused ion beam device including the control device which irradiates an ion beam on a sample and prepares a cross section on the sample while changing a tilt angle of the ion beam to the optical axis.

In the present embodiment, a processing observation method of a sample for use in the focused ion beam device including a sample stage which mounts a sample, an ion source which discharges an ion beam, a aperture which narrows down the ion beam discharged from the ion source, a tilting deflector which deflects the ion beam passed through the aperture, a beam scanner which scans the ion beam passed through the tilting deflector, an objective lens which irradiates the ion beam passed through the beam scanner on a sample, and a control device which controls the aperture, the tilting deflector, the beam scanner, and the objective lens, includes allowing the aperture to be moved out of an optical axis, the tilting deflector to deflect an ion beam in the same direction as the aperture is moved, the ion beam to pass through out of the optical axis of the objective lens, and the ion beam tilted to the optical axis to be irradiated on a sample.

In the present embodiment, disclosed is a processing observation method of a sample for changing a tilt of an ion beam to an optical axis when a combination of an aperture position, a tilting deflector voltage, an objective lens voltage, and a beam scanner voltage is changed.

In the present embodiment, disclosed is the processing observation method of a sample for displaying a direction or/and incidence angle of a tilted beam on a display device of the focused ion beam device.

In the present embodiment, disclosed is the processing observation method of a sample for setting a convergent point of a lens located upstream of the aperture within the tilting deflector.

In the present embodiment, disclosed is the processing observation method of a sample for irradiating an ion beam tilted to the optical axis on a sample and preparing a thin film having a nearly uniform film thickness.

In the present embodiment, disclosed is the processing observation method of a sample for irradiating an ion beam tilted to the optical axis on a sample and forming a cross section image from a secondary particle signal generated along with cross section processing of the sample.

In the present embodiment, disclosed is the processing observation method of a sample for finishing cross section processing in the case where the formed cross section image satisfies a predetermined condition.

In the present embodiment, disclosed is the processing observation method of a sample for changing a processing condition in the case where the formed cross section image satisfies a predetermined condition.

In the present embodiment, disclosed is the processing observation method of a sample for irradiating an ion beam tilted to the optical axis on a sample and preparing a pillar sample having the nearly same tilt as that of a side surface of the sample.

In the present embodiment, disclosed is the processing observation method of a sample for irradiating an ion beam tilted to the optical axis on a micro-sample and fixing the micro-sample and a fixed object by using a deposition film.

In the present embodiment, disclosed is the processing observation method of a sample for irradiating an ion beam on a sample and preparing a cross section on the sample while changing a tilt angle of the ion beam to the optical axis.

The above-described and other new features and effects will be described later with reference to the drawings. Each embodiment can be arbitrarily combined and the combination form is also disclosed in the present specification.

First Embodiment

In the present embodiment, thin-film processing using a tilted beam will be described.

FIG. 1 is a configuration diagram illustrating a focused ion beam optical system according to the present embodiment. The focused ion beam optical system mainly includes an ion source 1, a condenser lens 2, an aligner 3, a movable aperture 4, a tilting deflector 5, a blanker 6, a beam scanner 7, an objective lens 8, and a sample stage 9. In this focused ion beam optical system, the tilting deflector 5 is the same deflector of eight-pole structure as the aligner, and can deflect an ion beam in an arbitrary direction.

Figure 2:
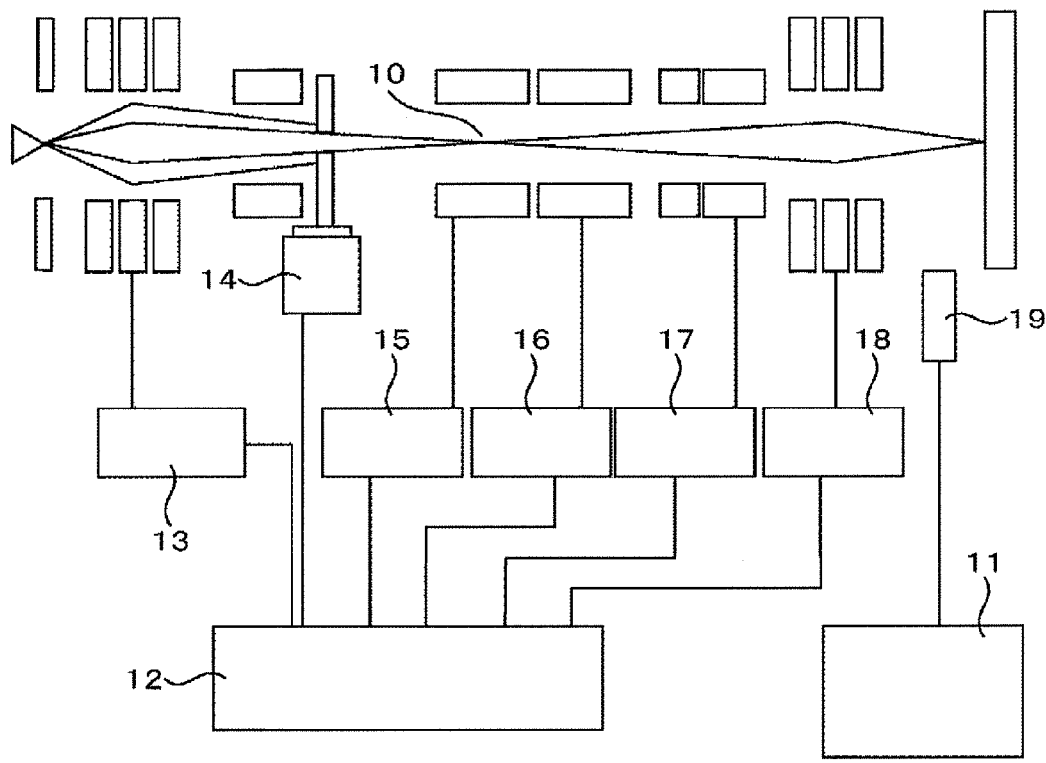
FIG. 2 is a configuration diagram illustrating a device control system.

FIG. 2 is a control system diagram illustrating the focused ion beam optical system. While observing a sample by using an image display device 11 using as an input signal a secondary electron detector 19, an operator performs a device operation through a control computer 12. During the normal observation or processing, a beam fails to have an intermediate convergence point 10 between a condenser lens and an objective lens. However, when selecting a tilted beam, the operator elevates a condenser lens voltage more than a voltage at normal times, and subjects a beam to an intermediate convergence within the tilting deflector 5. The operator allows a movable aperture drive mechanism to be operated, staggers an aperture hole of the movable aperture 4 in the direction in which a beam is tilted from the optical axis, and changes an incidence angle to the objective lens by using the tilting deflector 5. A moving amount of an aperture and setting of tilting deflector voltage in the tilted beam depend on a tilt angle. In the present embodiment, fundamentally, an adjusted value is stored in the control computer 12 and its registration value is reproduced, based on an adjustment procedure described later.

A first step of adjusting the tilted beam is to adjust a condenser lens voltage and match an intermediate convergence point of the beam with an interior portion of the tilting deflector. For that purpose, the following matters are performed.

While operating the tilting deflector in a level of ±10 V and 1 Hz, the objective lens voltage is adjusted so that a secondary electron image fails to move. Thereafter, the condenser lens voltage is adjusted and a focus is matched with the sample. Through this operation, a beam locking condition in which even if a voltage is imposed on the tilting deflector, an irradiation position on the sample fails to move can be achieved. Under this state, a sample stage is operated and a feature object or mark in which an irradiation position can be identified is set.

Figure 3:
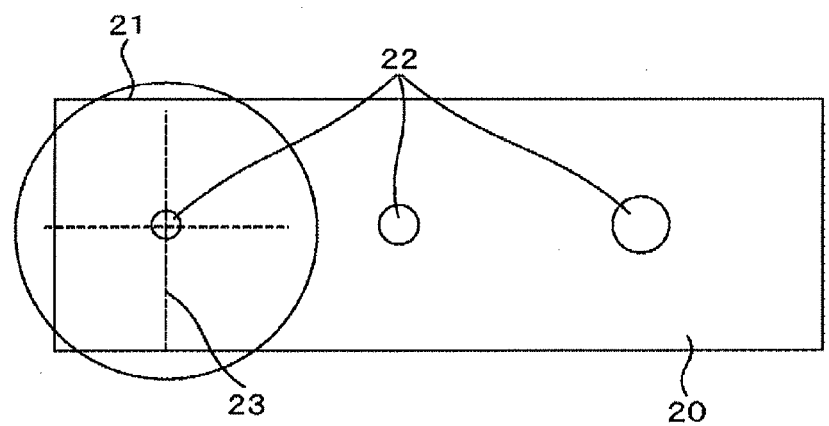
FIG. 3 illustrates an arrangement of an aperture plate and an aperture opening.
Figure 4:
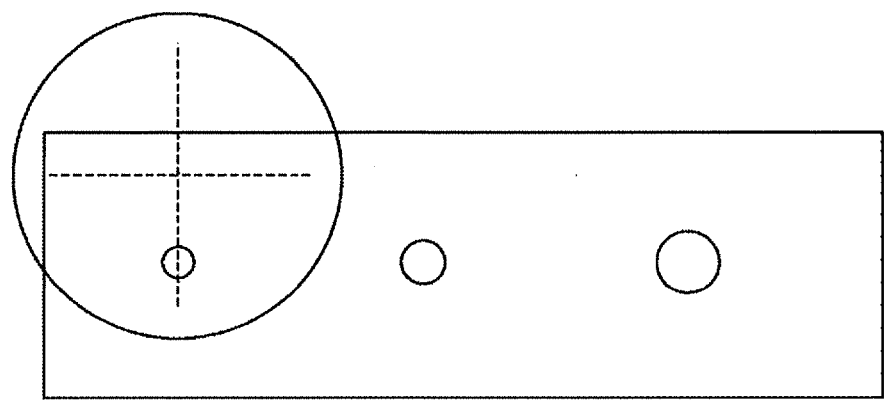
FIG. 4 illustrates an arrangement of an aperture plate and an aperture opening (at the time of tilting a beam)
Figure 5:
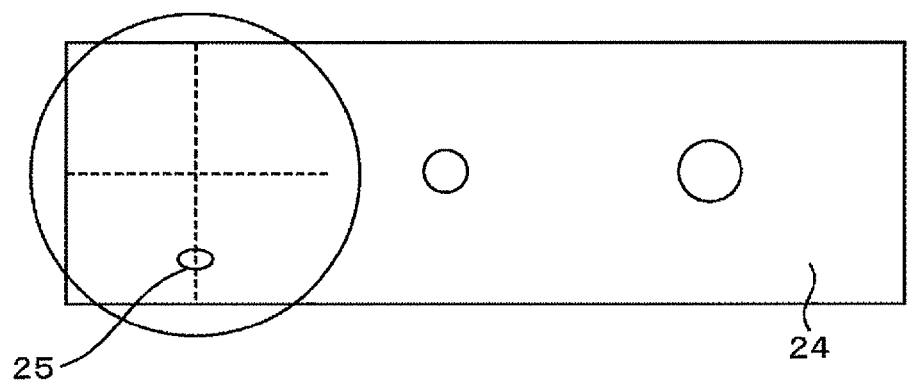
FIG. 5 illustrates an arrangement of an aperture plate and an aperture opening (modification example of an aperture plate)
Figure 6:
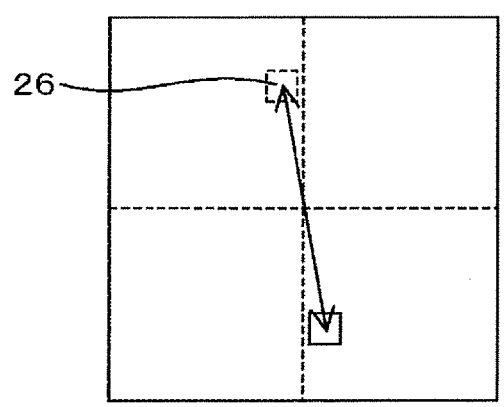
FIG. 6 illustrates a method for measuring a beam tilt angle (in the case where a direction in which a feature object moves and a tilt direction are not parallel to each other)
Figure 7:
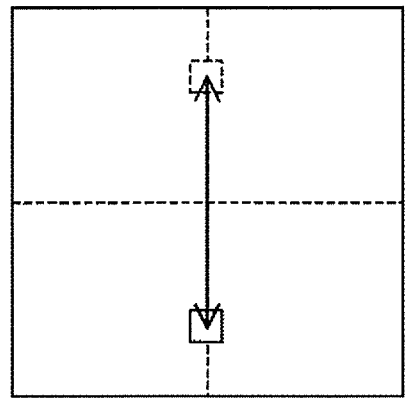
FIG. 7 illustrates a method for measuring a beam tilt angle (in the case where a direction in which a feature object moves and a tilt direction are parallel to each other)

A second step is to stagger the aperture hole of the movable aperture from the optical axis. An optimal distance for staggering the aperture hole is determined by a tilt angle for cancelling an aberration. Since an optimal distance with respect to a tilt angle (to 1°) for practical use is larger than a radius of a beam irradiation range on the movable aperture, it may be set in nearly 50% of the radius in the beam irradiation range. FIG. 4 illustrates a positional relationship between the beam irradiation range 21 on the aperture plate 20 and the aperture opening 22. As compared with a position of the aperture plate in normal use illustrated in FIG. 3, the aperture opening 22 of FIG. 4 is shifted from a position of the optical axis indicated by a cross-shape. In the case where a plurality of tilted beams having different tilt directions and angles are defined, a shift distance or direction of the aperture needs to be determined, respectively. After determining a position of the aperture opening of the tiled beam, while changing the objective lens voltage by nearly several volts, a secondary electron image is observed and a moving direction of the image is confirmed to be matched with a direction desired to tilt a beam (FIGS. 6 and 7). In the case where the moving direction of the image is not matched with a direction (here, a down direction of the image) desired to tilt a beam, a direction in which the feature object 26 of the image moves is not parallel to a direction to tilt a beam as illustrated in FIG. 6. In this case, the aperture position is mechanically adjusted and the moving direction of the image is allowed to be matched with the direction desired to tilt a beam as illustrated in FIG. 7. An aperture moving mechanism mounted on this device is two-axis driving and has a location accuracy of 1 μm or less in each axis. The aperture moving mechanism preferably has a location accuracy in a level of a diameter in the aperture opening to be used. As illustrated in FIG. 5, when a aperture plate in which an aperture is provided in a previously staggered position is used, a drive mechanism of two axes need not be used. Since a beam blurring in the tilt direction becomes large at the time of the tilt, the aperture may have not a perfect circle but an elliptical shape being flat in the tilt direction.

Figure 8:
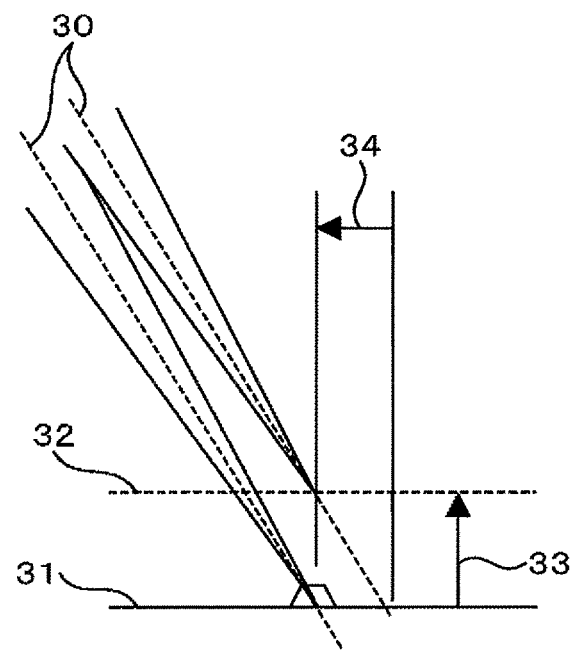
FIG. 8 illustrates a method for calibrating a tilt direction.
Figure 9:
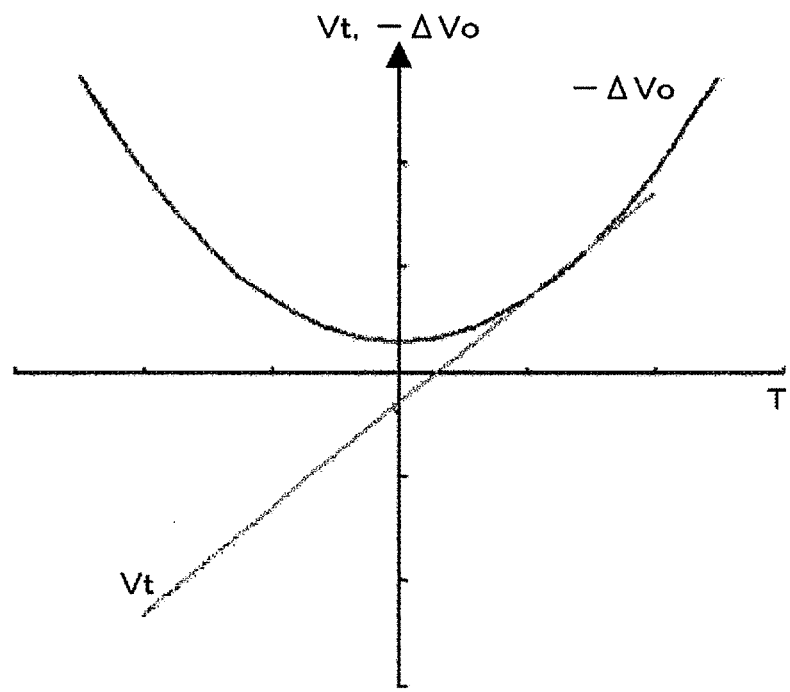
FIG. 9 illustrates a relationship between a tilt angle, a tilting deflector voltage, and an objective lens voltage adjustment value.

A third step is to measure a tilt angle of a beam and set a deflection voltage of the tilting deflector. To the tilting deflector, a deflection voltage is applied in the range of passing through an electrode hole of the objective lens, and an objective lens voltage is changed by several volts. Through the process, a focusing position changes, and at the same time, the secondary electron image moves. As typically illustrated in FIG. 8, when a value of a change 33 in a focusing height due to a change in the lens voltage is set as ΔZ and a value of a shift 34 of the image is set as ΔY, a tilt angle θ of a beam is represented by tan θ=ΔY/ΔZ. A voltage of the tilting deflector is adjusted so as to acquire a value of necessary θ. When a changing rate (dZ/dV) of a focusing distance to the objective lens voltage is previously measured and a focus variation rate is previously calculated at the time of changing the objective lens voltage by a steady value, the deflector voltage can be determined based on a length measurement of a shaped width in the secondary electron image. Even when a voltage of the tilting deflector is set just as a position of the aperture opening is finely adjusted, a tilt direction is confirmed while changing the objective lens voltage. For the purpose of cancelling an aberration, a deflection direction of the tilting deflector and a shift direction of the aperture opening are the same as each other, and further an adjustment may be required due to an error of the aperture mechanism or alignment. When the aperture position is present on the optical axis, a tilt angle T increases proportionally to a voltage Vt of the tilting deflector. In the case where the aperture position is displaced from the optical axis, since failing to originally pass through a center of the objective lens, the beam is tilted. For this purpose, when the beam is deflected by using the tilting deflector as illustrated in FIG. 9 and it passes through near the center of the lens, the tilt angle becomes equal to nearly zero.

At the final step, the objective lens voltage is adjusted so as to bring a beam into focus most in a tilted state, and a correction voltage for shifting an image is calculated so as to return the mark set on the sample at a first step to an original position on the screen. Since the objective lens voltage to be adjusted is necessarily lower than that at the time of vertical incidence, a value of ΔVo is negative. As illustrated in FIG. 9, an absolute value is nearly proportional to a square of the tilt angle. This fact is set as a function of the tilt angle, or registered in a control system as a table for control. Much the same is true on a position correction shift voltage. Since an incident point on the lens is not changed in this shift, it is performed not by the tilting deflector but by the beam scanner 7 (FIG. 1). The focus voltage in the case where the tilt angle is small is not nearly changed with that at non-tilting time, and therefore the focus voltage need not be changed. Or alternatively, in the case where a beam cannot be skillfully brought into focus only by the adjustment of the objective lens voltage, an astigmatism corrector may be used.

With that, the tilted beam can be adjusted. A condenser lens voltage, coordinates of a aperture drive mechanism, a tilting deflector voltage, an objective lens voltage, a correction shift voltage, and an astigmatism correction voltage are one combination of registration values, and stored in a control computer. Here, the adjustment of an aligner axis is supposed to be performed at the time of normal beam adjustment before registration of the tilted beam.

For the purpose of performing finish processing of a thin film prepared in the screen horizontal direction, the tilt of ±2° is performed in the vertical direction (Y direction) of the image. Therefore, two beams of +2° and −2° are adjusted by using an acceleration voltage 30 kV and registered. The aperture diameter is 30 μm, a shift distance from the optical axis is ±150 μm, and the tilting deflector voltage is +10.20V and −10.35V in the Y direction, respectively. With regard to the objective lens voltage, any of the tilted beams of ±2° are set lower by 30V than that of the non-tilted beam. It is oddly considered that absolute values of the deflection voltages of the same tilt angle are different from each other. However, it is considered that an error of an optical system alignment is included.

Figure 10:
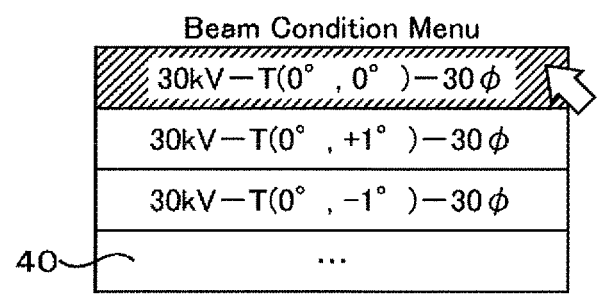
FIG. 10 illustrates a selection GUI of a tilt processing condition.
Figure 11:
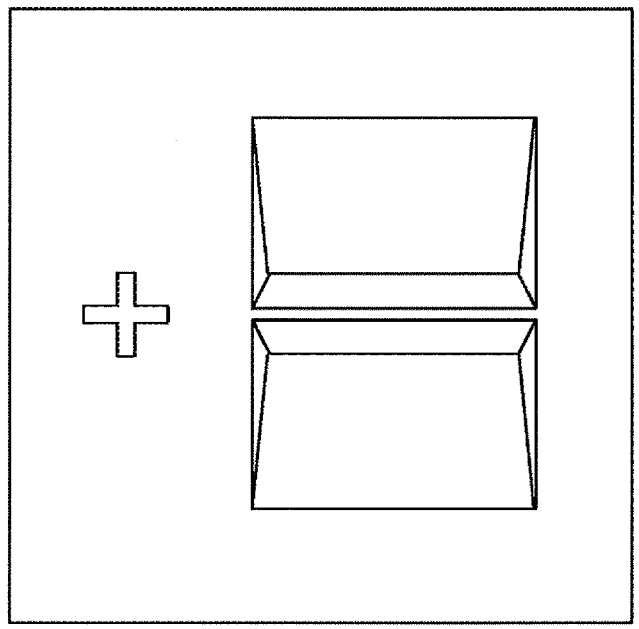
FIG. 11 illustrates an SIM image through a non-tilted beam.
Figure 12:
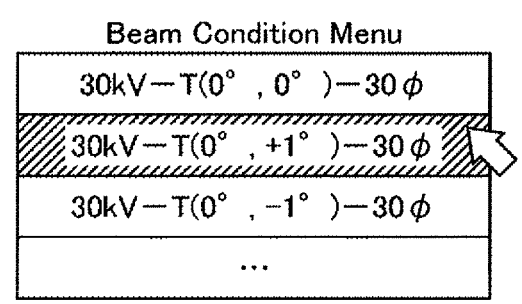
FIG. 12 illustrates a selection GUI of a tilt processing condition.
Figure 13:
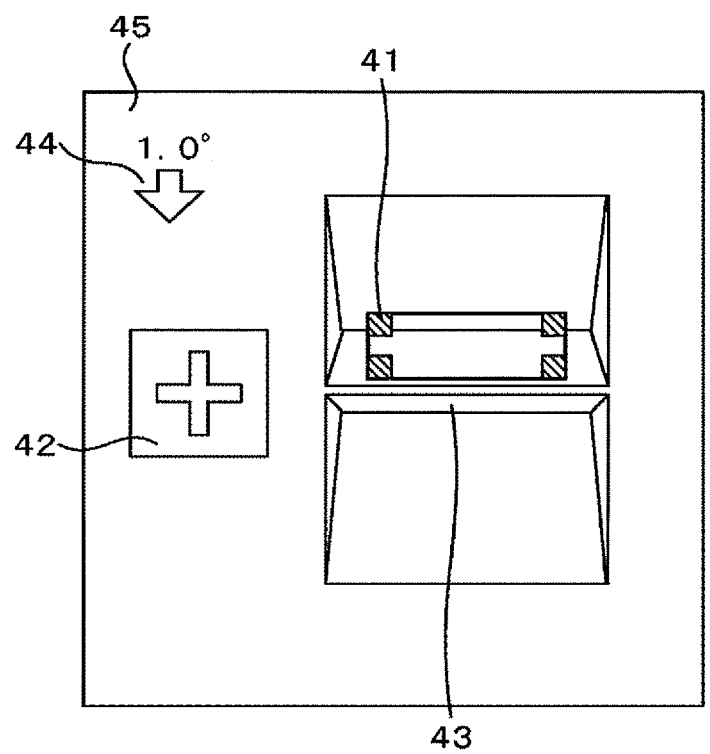
FIG. 13 illustrates processing positioning using an SIM image through a tilted beam.

In the focused ion beam device according to the present embodiment, beam conditions of different incidence angles can be registered by using the same acceleration voltage or aperture. To avoid a mixed use, registration conditions are clearly discriminated on the software by using GUI (FIG. 10). A displayed selection menu 40 of the beam conditions includes an acceleration voltage, an X direction tilt angle, a Y direction tilt angle, and a aperture opening diameter. T represents a tilted beam. For example, 30 kV–T(0°, +1°)–30φ represents that a tilted beam of an acceleration voltage 30 kV is tilted by +1° in the Y direction and a variable aperture of diameter 30 μm is selected. As compared with a normal beam having no intermediate convergence point, the tilted beam has a high current density on the variable aperture, and therefore the tilted beam is several times as large as the normal beam in a beam current and a processing speed is fast even in the same aperture diameter. Accordingly, this discrimination is preferably cleared. In even the tilted beam, the tilt angle can be set to 0°, and FIG. 11 illustrates a screen in which the beam is selected, a secondary electron image is taken in, and setting of thin film processing is performed. When the tilted beam is selected so as not to mixedly use the tilted beam and the vertical beam, the registered beam direction and absolute value of the tilt angle are screen-displayed on a captured screen of the secondary electron image by an arrow 44 and a value 45. Note that since an observation may be interrupted, these displays can be set to nondisplay as an optional extra.

In the case where processing is performed by using the normal beam, the setting of combining it with a slant shift of a stage is required. In this case, since the beam is tilted, a stage tilt is not required. In a processing registration through the tilted beam, an image is actually captured by using the tilted beam and a shape of a processing area designation graphic 41 is determined on the image. Since a side surface part of a thin wall to be processed can be aimed and a processing area can be disposed, a failure in which an upper part of the thin film is sputtered and broken is small. In addition, the tilted beam with a large beam current has a large merit in terms of a throughput. Since an image recognition fails to receive an influence due to a tilt angle of 2°, automatic processing can be performed by using a position correction mark 42. Since the stage is not moved, a previous adjustment of eucentric tilt is not required. An influence such as a displacement and beam blurring is exerted due to a displacement of a sample height. However, there is no problem in the range of ±2 μm and the tilted beam can be used in the same manner as in the normal vertical beam.

Figure 14:
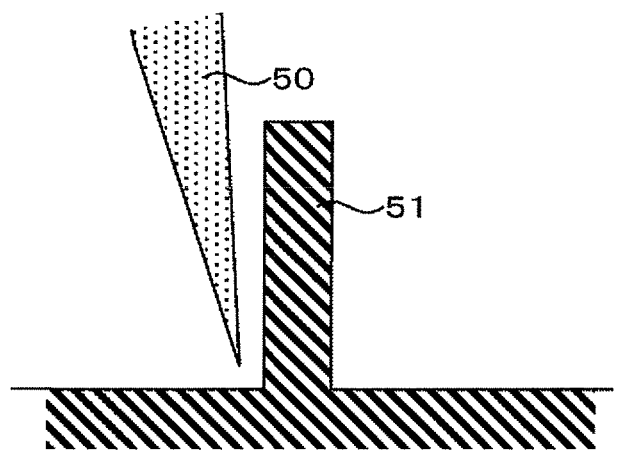
FIG. 14 is a schematic diagram of a cross section shape through thin film processing using a tilted beam.
Figure 15:
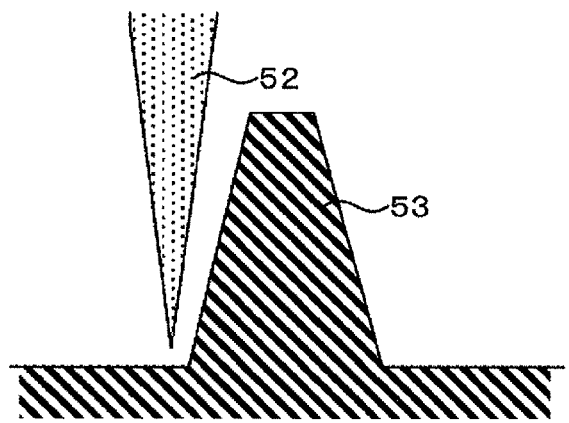
FIG. 15 is a schematic diagram of a cross section shape through thin film processing using a vertical beam.

FIG. 14 typically illustrates a cross section shape 51 of a thin film through the tilted beam 50. A thin film having a uniform film thickness can be prepared in the same manner as in the time of tilting the sample stage. A reference numeral 53 of FIG. 15 denotes a cross section shape at the time of performing processing by a non-tilted beam 52, and since a lower part is thick, it fails to transmit an electron at the time of TEM observation.

According to the present embodiment, provided is the focused ion beam device in which since an optical condition of beam tilt can be reproduced in a necessary case and a tilt direction and angle can be displayed, a processing condition is easily confirmed, a formation condition of a tilted beam is simply adjusted, and working efficiency is high.

According to the present embodiment, when a beam is tilted and thin film processing is performed, a taper shape due to beam flare is eliminated, thin film processing of a nearly vertical shape is performed without tilting a sample, and a sample having preferable transmissivity of an electron beam and a uniform film thickness is easily prepared.

Second Embodiment

In the present embodiment, cross section processing in which an analysis through a cross section SEM image is automatically started from a desired cross section is performed by using a tilted beam. Hereinafter, the second embodiment will be described with a focus on a difference from the first embodiment.

Figure 16:
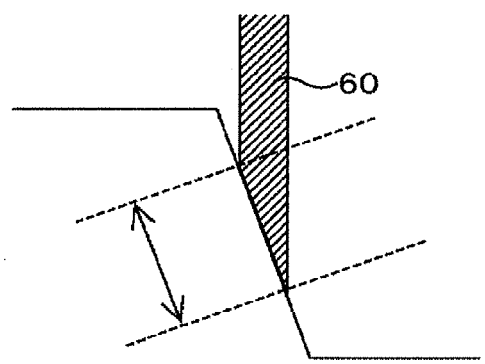
FIG. 16 is a conceptual diagram of a cross section observation during processing using a vertical beam.
Figure 17:
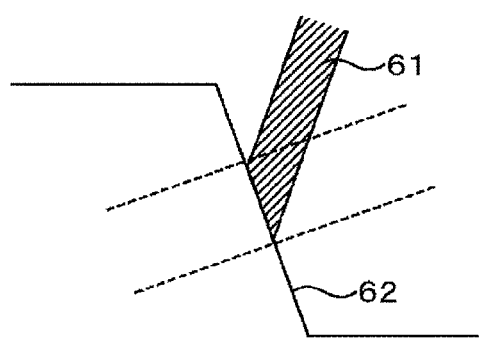
FIG. 17 is a conceptual diagram of a cross section observation during processing using a tilted beam.

A cross section image during processing using an ion beam is conventionally acquired from an image stretch. As illustrated in FIG. 16 by an arrow, however, since an incidence angle θ (an angle to an observation sample surface) is small in the vertical beam, an irradiation range of beams is stretched to 1/sin θ times on the cross section and resolution in the tilt direction is largely reduced. In the case where the cross section image is pattern-recognized, reliability is low. However, when a processing beam 60 is slightly tilted, the resolution of a decompression cross section image is largely improved (b). The reason is that θ with respect to the tilted beam 61 is several times as large as θ (≈0) with respect to the vertical beam.

Figures 1, 18:
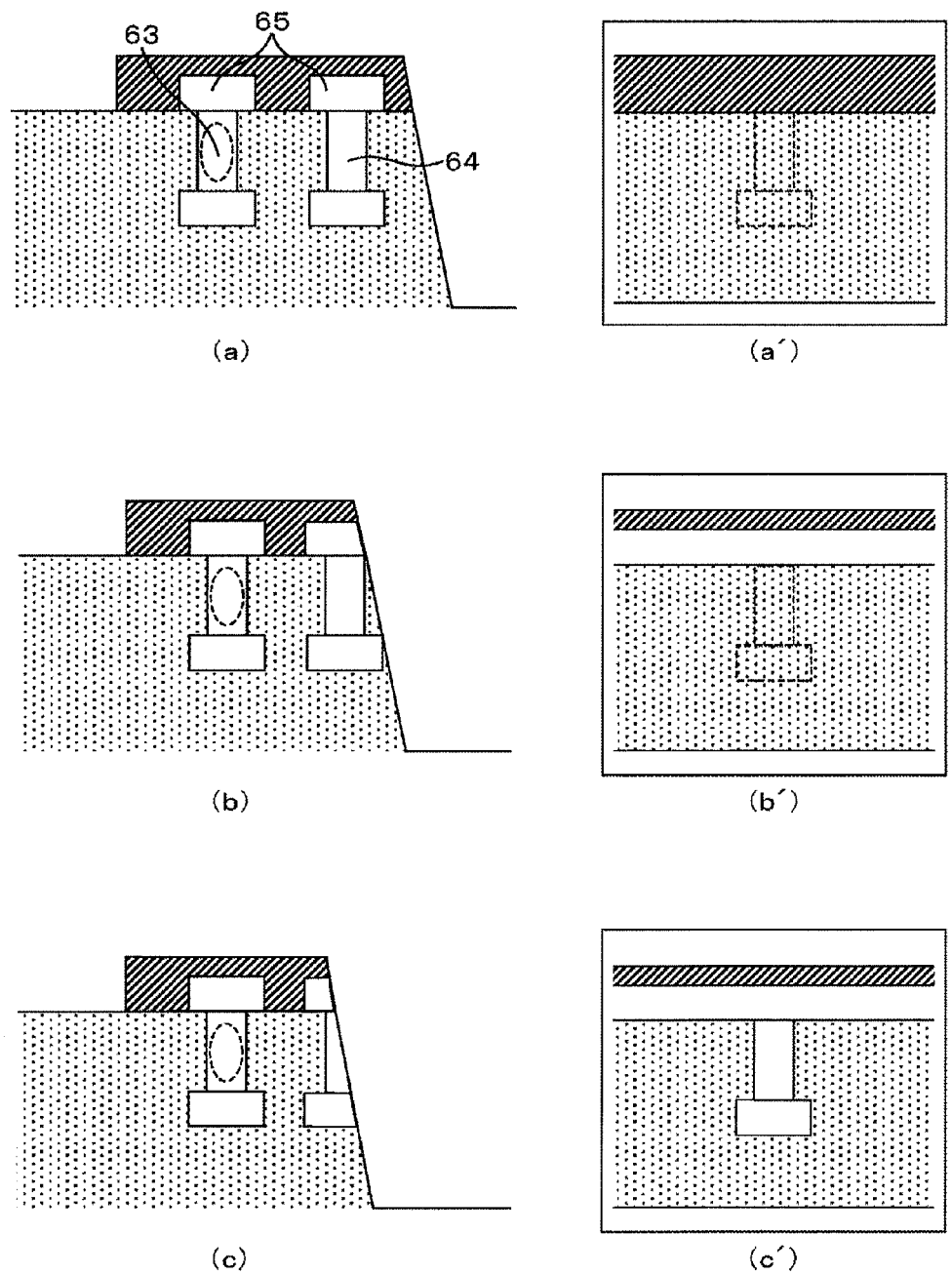
Figure 19:
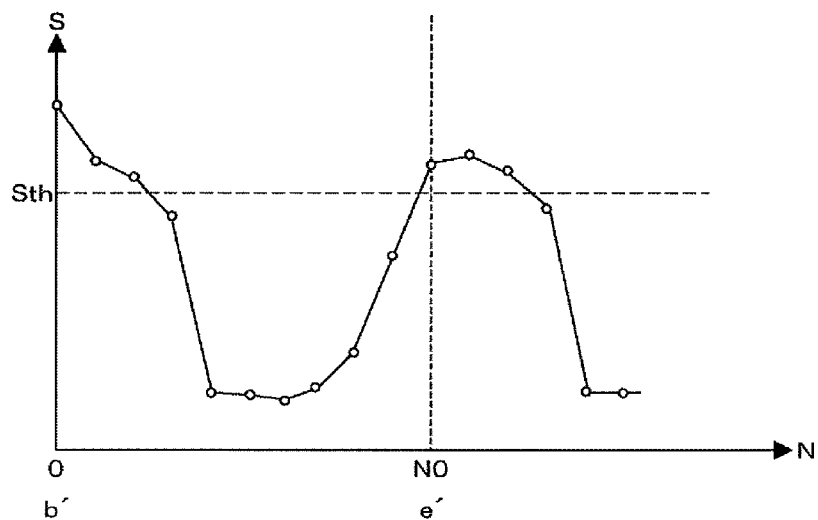
FIG. 19 illustrates a change in a matching score between a reference image and a cross section observation image during processing.
Figure 20:
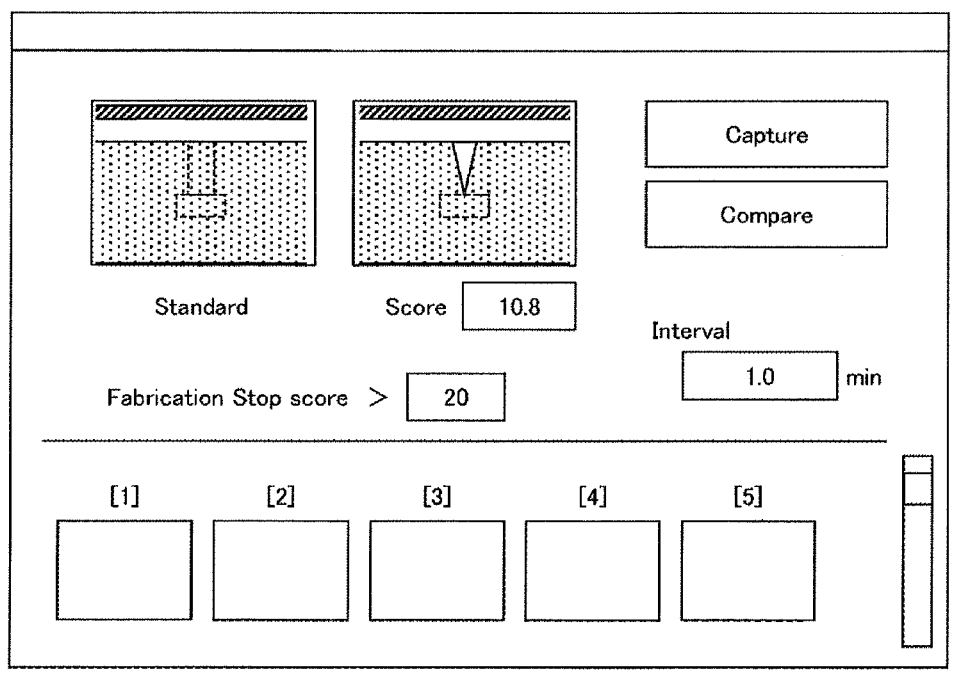
FIG. 20 illustrates a setting screen for cross section observation processing.
Figure 21:
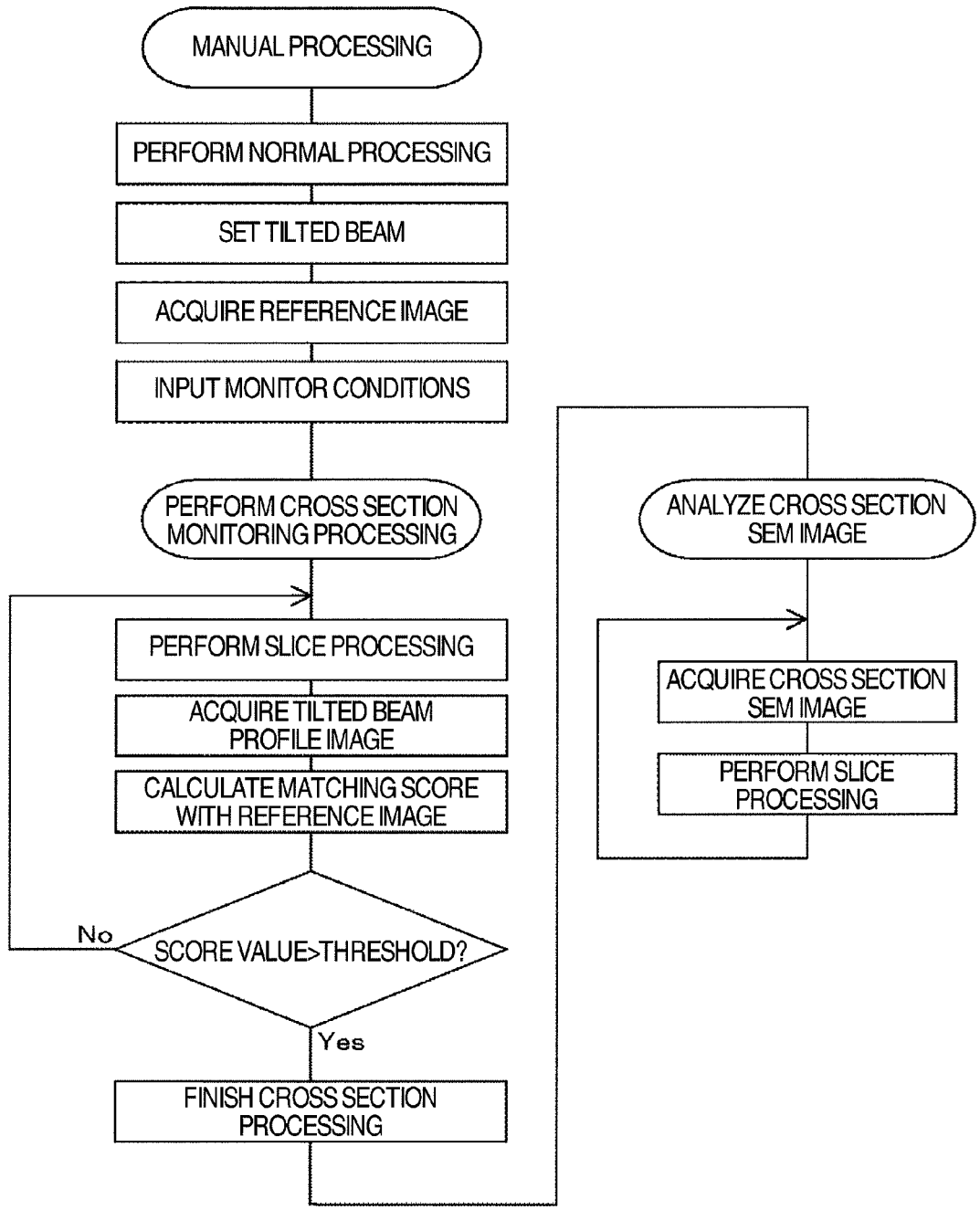
FIG. 21 is a flowchart illustrating an automatic switching of a cross section observation during processing and a cross section SEM monitor.

Using the above, a process in which an end point of cross section processing is automatically detected by using pattern recognition and a cross section SEM observation is performed will be described with reference to FIG. 18. Images (a), (b), ..., (f) illustrate structures in which a cross section is viewed from a vertical direction, and images (a'), (b'), ..., (f') illustrate cross section images obtained by stretching secondary electron signals obtained by the tilted beam. In the case where a cross section analysis of a defective plug 63 illustrated in FIG. 18A is performed, a plug 64 having similar shapes is manually subjected to cross section processing and a reference image (FIG. 18B') is acquired through the tilted beam. Thereafter, while slice processing in which a cross section is gradually trimmed automatically is advanced, the cross section image is periodically captured by using the tilted beam, matched with the reference image, and a score is calculated. As a result, the score indicates a behavior illustrated in FIG. 19. When advancing the processing, the score increases at the time when a similar cross section shape (e') appears, and as a result it can be determined that the processing reaches a desired cross section. When a plug unit appears at the cross section, the score gradually decreases and, when an upper wiring part 65 is eliminated, it is drastically reduced. Here, the control is performed through a flow in which a threshold Sth is set, when a cross section image larger than Sth is detected in the score (here, from matching of NO-th cross section image), the processing is finished, and capturing of the cross section SEM image is started (FIG. 21). The setting of processing termination conditions of this device is performed through an interface of FIG. 20. The capturing of the reference image through the tilted beam, the setting of the threshold, and an interval of a cross section image capturing through the tilted beam can be set on this screen. Processing in which a comparison range is limited to a part of the cross section images can be performed. In this device, this setting screen belongs to a cross section processing step and the setting of capturing analysis of the cross section SEM is performed on another setting screen. Further, when the process is continuously performed, information such as a cross section processing position is transferred.

As a result, a capturing process of the SEM image can be limited only to the vicinity of an analysis point. As a trigger for starting the capturing of the cross section SEM image, since a score value has large variation, a method for counting a local maximal point or local minimal point in which a moving average of the score is taken is also effective. Further, also in the case where a plurality of similar structures of semiconductor devices are used, any one of them can be specified to start an analysis.

Since processing is advanced also during the capturing of images through the tilted beam, control switching of the focused ion beam and the SEM, and processing interruption during the capturing of images can be avoided and a processing time can be shortened. Since unnecessary data is not captured, the accumulated amount of image data is also reduced. Using as a trigger a matching score, an adjustment for changing a current value of an ion beam or processing conditions and a pretreatment for manually performing an analysis can be also automated.

According to the present embodiment, when a beam is tilted and an image is scanned on a cross section, resolution on the cross section can be improved, pattern recognition whether a necessary shape appears can be made, and processing control can be easily automated.

Third Embodiment

In the present embodiment, described is an example in which a beam tilt function is applied to a step of sequentially repeating FIB processing and cross section SEM observation and measuring a structure within a semiconductor in the FIB-SEM. Hereinafter, the third embodiment will be described with a focus on a difference from the first and second embodiments.

Figure 22:
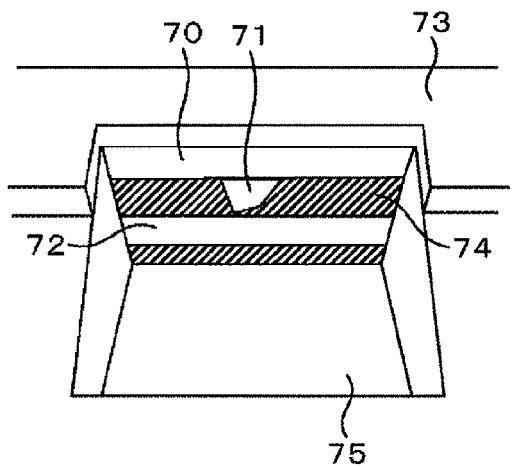
FIG. 22 illustrates a cross section observation and processing of a tilted sample in an FIB-SEM (in the case where a cross section is not matched with a laminate direction of a device)
Figure 23:
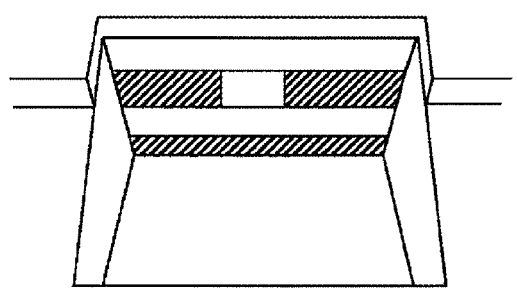
FIG. 23 illustrates a cross section observation and processing of a tilted sample in an FIB-SEM (in the case where a cross section is matched with a laminate direction of a device)
Figure 24:
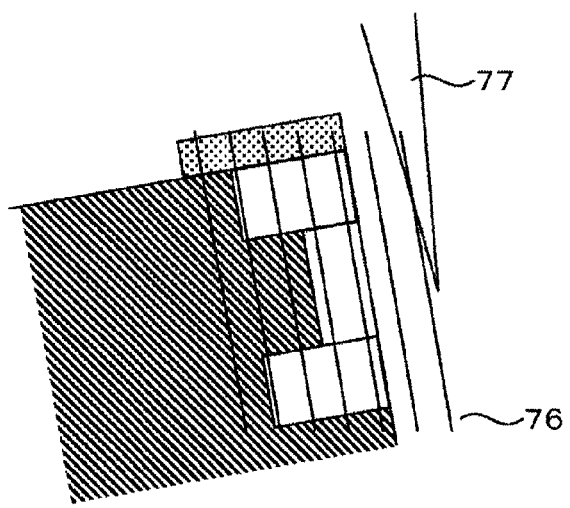
FIG. 24 illustrates a cross section in which an angle is corrected.

The measurement according to the present embodiment is performed to a wafer sample of 300 mm. A warpage is easy to be generated in a wafer of large diameter and a normal direction on a sample surface is not matched with a processing cross section through the FIB in many cases. Accordingly, a correction is required at the time of reconstructing a three-dimensional structure from a cross section image. FIG. 22 illustrates a cross section SEM image at the time of performing preliminary cross section processing. It is seen from FIG. 22 that a junction between a lower wiring layer 72 and an interlayer wiring layer 71 is already processed and eliminated and the cross section is not correctly matched with the laminate direction of the device as compared with a case where a portion near an upper wiring layer 70 of the interlayer wiring layer 71 is left. Therefore, a processing beam is tilted from a vertical direction by 0.5° to perform processing, and as a result, the above phenomenon is not viewed as illustrated in FIG. 23. The reason is considered that as illustrated in a schematic diagram of FIG. 24, a cross section 76 is tilted through processing using the tilted beam 77 and matched with the device laminate direction. In this case, when the three-dimensional structure is reconstructed from a cross section observation image of the SEM, this 0.5° is added.

In the present embodiment, a sample is supposed to be tilted. It is considered that a beam is actually tilted and made incident due to an alignment error of the FIB optical system or an assembling axis deviation error of an electrostatic lens electrode. Also in such a case, the correction can be similarly performed by setting the tilt angle. When a taper angle becomes large on only one surface of thin film samples as a defective case, the correction is effective.

Fourth Embodiment

In the present embodiment, described is an example in which a beam tilt function is applied to preparation of a pillar sample used at the time of three-dimensionally measuring a device structure by using a transmission electron microscope.

Hereinafter, the fourth embodiment will be described with a focus on a difference from the first to third embodiments.

Figure 25:
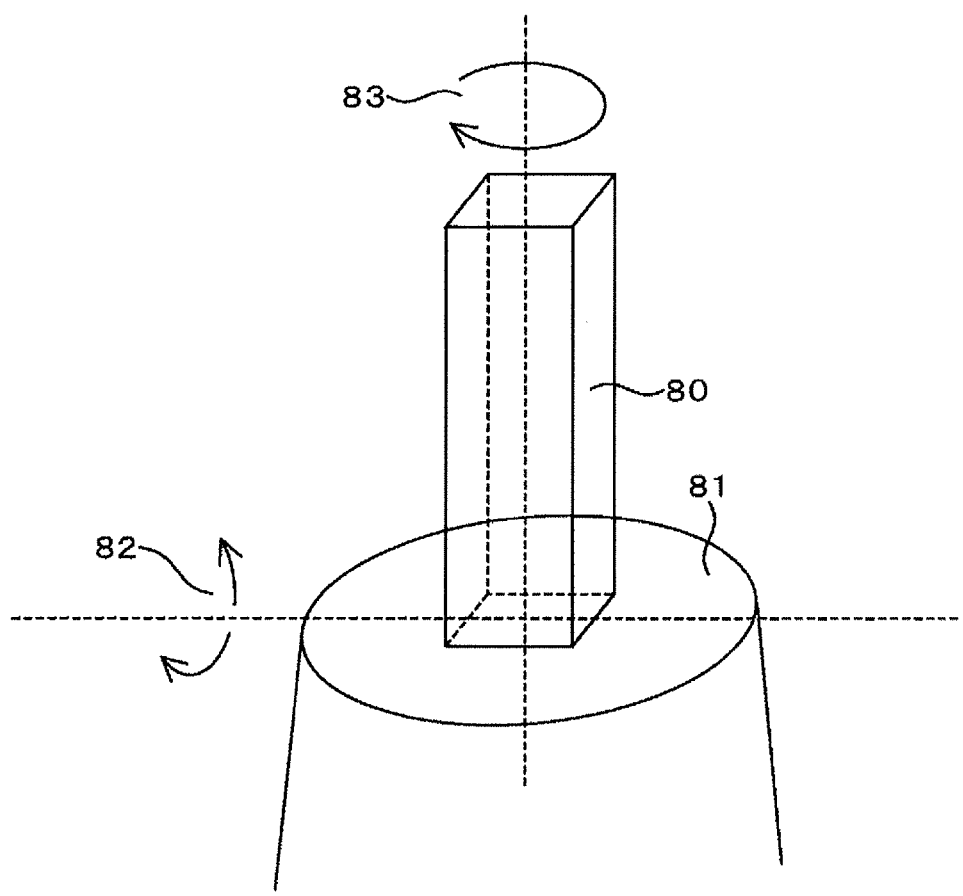
FIG. 25 illustrates a rotary sample stage and a pillar sample.

FIG. 25 illustrates an example in which when a aperture is two-dimensionally moved around the optical axis, a pillar sample is prepared. The pillar sample 80 is used at the time of three-dimensionally measuring a device structure by using a transmission electron microscope. In order that a vision may be made the same as each other at the time of rotating the sample on a fixed sample surface at the center of the vertical axis, a finishing angle of each surface of the column is required to be kept the same as much as possible. When the processing is performed while going to and from the transmission electron microscope and the focused ion beam device, the sample is preferably placed on a side entry stage holder capable of rotating the sample. However, a rotary sample holder 81 has angle accuracy of only nearly ±3° in a rotational transfer. In terms of precision, it is extremely difficult to perfect four surfaces through the rotation to the tilt. Accordingly, while tilting the rotary sample holder, the processing is performed only in the vertical direction (Y direction), and the surfaces in the horizontal direction are perfected changing the tilt direction of the beam.

Figure 26:
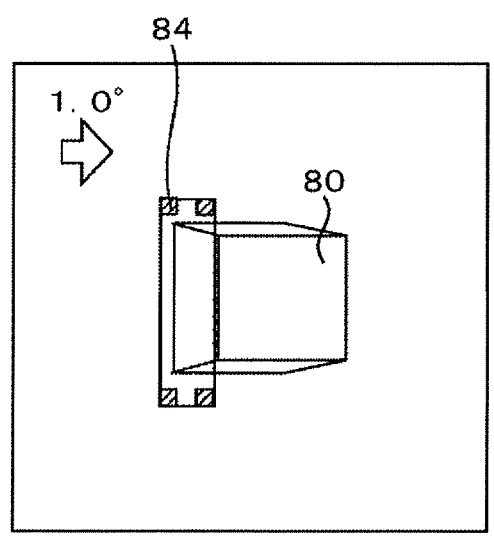
FIG. 26 illustrates processing using a horizontal direction tilted beam (in the case where finish processing of a left surface is performed)
Figure 27:
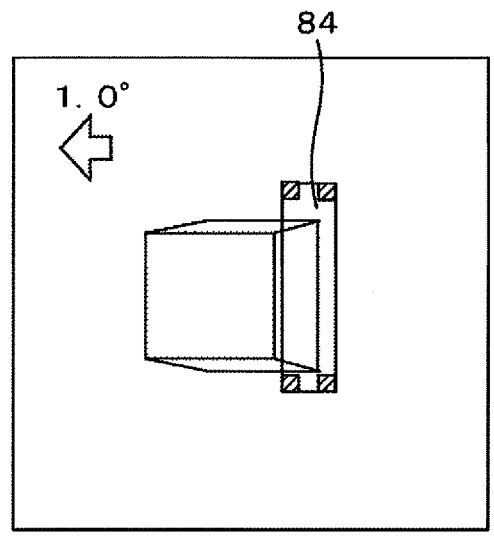
FIG. 27 illustrates processing using a horizontal direction tilted beam (in the case where finish processing of a right surface is performed)

Here, the beam of ±1° in the X direction is previously registered and a processing area designation graphic 84 of finish processing of each surface is set on the image of the tilted beam as illustrated in FIGS. 26 and 27. As a result, a taper is not present also on a surface in the horizontal direction in which the stage fails to be tilted, and therefore a nearly vertical surface can be formed.

Fifth Embodiment

A tilted beam can be used for other processing in addition to sputtering. In the present embodiment, an example in which a focused ion beam deposition is used will be described with a focus on a difference from the first to fourth embodiments.

Figure 28:
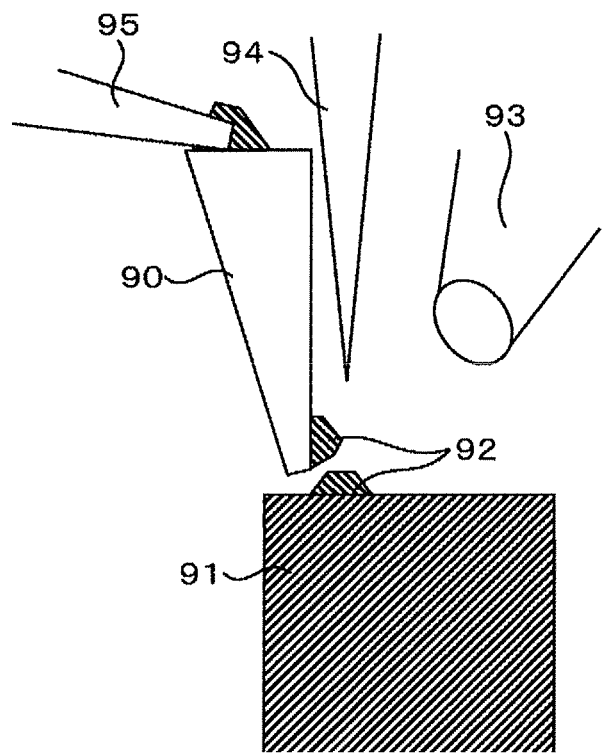
FIG. 28 illustrates deposition adhesion using a vertical beam (in the case where adhesion fails to be performed)
Figure 29:
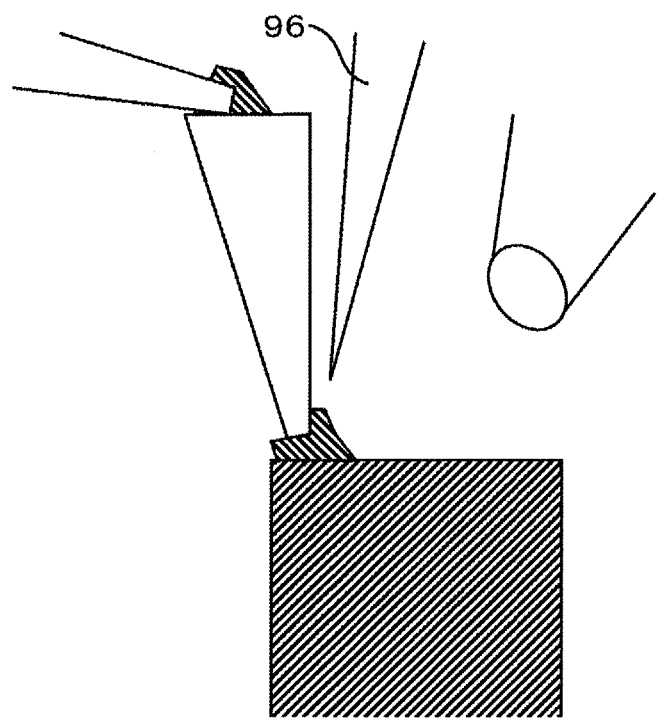
FIG. 29 illustrates deposition adhesion using a tilted beam.

Referring to FIGS. 28 and 29, described is an example in which a micro-sample 90 picked out from a substrate is stuck and fixed on an electron microscope sample holder 91 by using focused ion beam deposition. A bottom part is separated from the substrate by using the tilt of the sample stage, and the micro-sample 90 is fixed on the probe 95 by using the deposition. Thereafter, a junction between the micro-sample 90 and the substrate is cut off through sputtering and the micro-sample 90 is moved onto the sample holder after taking up the probe.

As illustrated in the drawing, an upper part of the above-described prepared micro-sample is thick and wedge-shaped. A thin edge part being a lower part of this micro-sample is stuck and fixed on a top surface or side surface of the electron microscope sample holder 91 by using the focused ion beam deposition. Since a bottom end of the micro-sample has no simple shape, whether the bottom end is contacted with the holder is not clearly seen in many cases through a scanning ion microscope image (SIM image) obtained by scanning a non-tilted focused ion beam. When the sample is stuck and fixed by using the deposition, the deposition film 92 may fail to be continued and stuck as illustrated in FIG. 28. However, when a tilted beam 96 is used at this sticking step, a beam is irradiated on the bottom end of the micro-sample with high accuracy. As a result, wrap-around of the deposition film 92 can be more effectively performed and yield can be improved.

Sixth Embodiment

In the present embodiment, an incidence angle of a focused ion beam at the time of cross section finish processing is changed for each frame in a direction parallel to a surface. The surface is finished so as to make an observation cross section flat, and a cross section measurement is easy to be performed. Hereinafter, the sixth embodiment will be described with a focus on a difference from the first to fifth embodiments.

Figure 30:
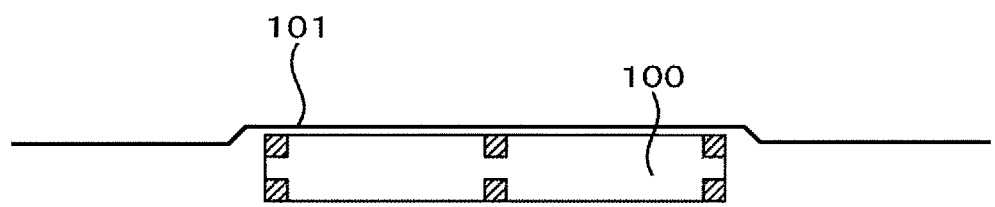
FIG. 30 illustrates a finish cross section and a processing area.
Figure 31:
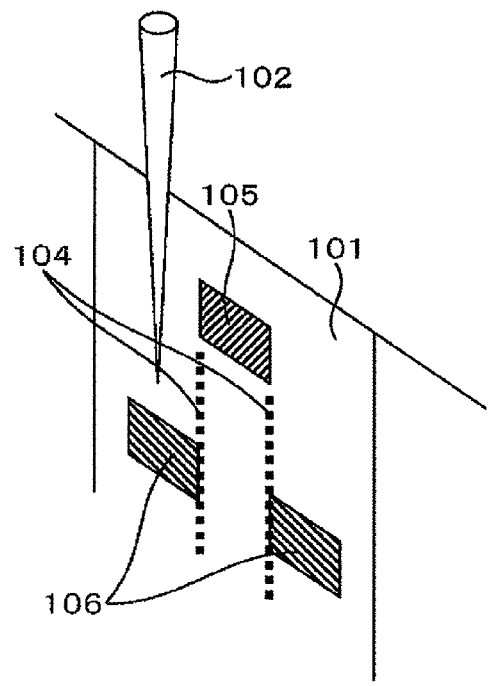
FIG. 31 illustrates a processing beam and a trace of a finish cross section (in the case of a vertical beam)
Figure 32:
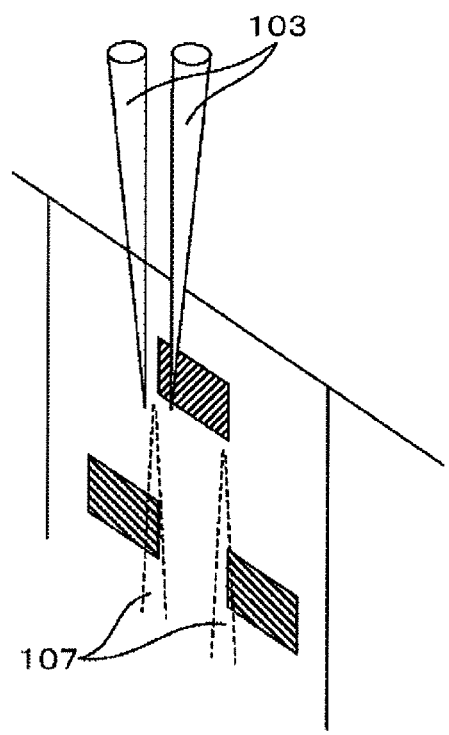
FIG. 32 illustrates a processing beam and a trace of a finish cross section (in the case of a tilted beam).

FIG. 30 illustrates a processing area designation graphic 100 of the secondary electron image observed from the upper part. A beam is raster-scanned for a finish cross section 101 with a main deflection being set as a long side direction of the processing area designation graphic 100. The tilt angle of beams is alternately changed to +2° and −2° in the horizontal direction for each frame. This is performed for each frame by switching a voltage of the tilting deflector on the objective lens to only an objective lens voltage. Since the tilt direction of beams changes, convergence of the beam can be improved in the case where a position of the aperture opening is also shifted in the horizontal direction as described in the optical system according to the first embodiment. In the finish processing, the scan is fast with a frame time being about 0.5 sec, and when a waiting time in which a aperture position is mechanically changed is added to a processing time, the processing time is several times as long as the frame time. Therefore, only the deflection voltage and objective lens voltage to be switched over a short amount of time are switched. A beam largely becomes blurry in the tilt direction, namely, in the direction parallel to the finish cross section 101, and has a flat shape; however, an influence is small because of the finish processing. As illustrated in FIG. 31, since the incident direction is alternately changed, linear processing traces (steps 104) are formed through the reflection of the structure 105 in the upper part of the cross section in the case where processing is performed by using a non-tilted beam. As illustrated in FIG. 32, the processing traces are averaged and become blurry as in a reference numeral 107, and as a result the cross section observation is easy to be performed. As in a holography thin film sample necessary for extremely high flatness, this method can be applied also to a case where there is a problem that noise of D/A conversion is overlapped and input.

INDUSTRIAL APPLICABILITY

According to the present embodiment, thin film processing and cross section processing using a focused ion beam can be automated, and yield can be improved. For example, when the present invention is applied to a cross section monitor to detect an end point, the cross section processing can be easily automated.

REFERENCE SIGNS LIST

1 Ion source
2 Condenser lens
3 Aligner
4 Movable aperture
5 Tilting deflector
6 Blanker
7 Beam scanner
8 Objective lens
9 Sample stage
10 beam crossover
11 Image display device
12 Control computer
13 Condenser lens power supply
14 Two-axis aperture drive mechanism
15 Tilting deflector power supply
16 Blanker power supply 17 Beam scanner power supply
18 Objective lens power supply
19 Secondary electron detector
20 Aperture plate
21 Beam irradiation area
22 Aperture opening
23 Optical axis position
24 Beam tilt special aperture plate
25 Elliptical aperture opening
26 (on a sample) Feature object
30 Beam incident direction
31 Sample surface
32 Over-focus height
33 Change in focus height
34 Shift of image
40 Selection menu of beam conditions
41 Processing area designation graphic
42 Position correction mark
43 Thin film processing area
50, 61, 77, 96, 103 Tilted beam
51 Cross section shape of thin film
52, 94, 102 Non-tilted beam
53 Thin film through non-tilted beam processing
60 (non-tilted) Beam
62 Processing cross section
63 Defective plug
64 (nondefective) Plug
65 Upper conductive layer portion
66 Cavity within defective plug
70 Upper conductive layer
71 Interlayer conductive layer
72 Lower conductive layer
73 Surface protection film
74 Insulation film
75 Window open processing
76 Angle-corrected cross section
80 Pillar sample
81 Rotary sample holder
82 Tilt direction
83 Rotation direction
84 Processing area designation graphic
90 Micro-sample
91 Electron microscope sample holder
92 Deposition film
93 Gas nozzle
95 Probe
100 Processing area designation graphic
101 Finish cross section
104 Step
105 Upper structure
106 Lower structure
107 Averaged processing trace

The invention claimed is:

1. A focused ion beam apparatus comprising:
a sample stage which mounts a sample;
an ion source which discharges an ion beam;
an aperture which narrows down the ion beam discharged from the ion source;
a condenser lens which is a first electrostatic lens, and which is located upstream of the aperture;
a tilting deflector which deflects the ion beam passed through the aperture;
a beam scanner which scans the ion beam passed through the tilting deflector;
an objective lens which is a second electrostatic lens, and which irradiates the ion beam passed through the beam scanner on a sample; and
a control device which controls the aperture, the tilting deflector, the beam scanner, the objective lens, and the condenser lens,
wherein the ion beam has no intermediate convergence point between the objective lens and the condenser lens during processing with a vertical beam or observing with the vertical beam, and
wherein, if a tilted beam is selected, the control device causes the ion beam to have the intermediate convergence point, the aperture to be moved out of an optical axis, the tilting deflector to deflect the ion beam in the same direction as the aperture is moved, the ion beam to pass through the objective lens out of the optical axis, and the ion beam tilted to the optical axis to be irradiated on the sample.

2. The focused ion beam apparatus according to claim 1, wherein the control device stores a combination of a condenser lens voltage, an aperture position, a tilting deflector voltage, an objective lens voltage, and a beam scanner voltage.

3. The focused ion beam apparatus according to claim 1, further comprising a display device which displays a direction of a tilted beam or/and an incidence angle.

4. The focused ion beam apparatus according to claim 1, wherein the intermediate convergence point is set within the tilting deflector.

5. The focused ion beam apparatus according to claim 1, wherein the control device irradiates the ion beam tilted to the optical axis on a sample and prepares a thin film having a nearly uniform film thickness.

6. The focused ion beam apparatus according to claim 1, wherein the control device irradiates the ion beam tilted to the optical axis on a sample and forms a cross section image from a secondary particle signal generated along with a cross section processing of the sample.

7. The focused ion beam apparatus according to claim 6, wherein the control device finishes cross section processing in the case where the formed cross section image satisfies a predetermined condition.

8. The focused ion beam apparatus according to claim 6, wherein the control device changes a processing condition in the case where the formed cross section image satisfies a predetermined condition.

9. The focused ion beam apparatus according to claim 1, wherein the control device irradiates the ion beam tilted to the optical axis on a sample and prepares a pillar sample having the nearly same tilt as that of a side surface of the sample.

10. The focused ion beam apparatus according to claim 1, wherein the control device irradiates the ion beam tilted to the optical axis on a micro-sample and fixes the micro-sample and a fixed object by using a deposition film.

11. The focused ion beam apparatus according to claim 1, wherein while changing a tilt angle of the ion beam to the optical axis, the control device irradiates the ion beam on a sample and prepares a cross section on the sample.

12. A processing observation method of a sample for use in a focused ion beam apparatus including:
a sample stage for mounting a sample;
an ion source for discharging an ion beam;
an aperture for narrowing down the ion beam discharged from the ion source;
a condenser lens which is a first electrostatic lens, and which is located upstream of the aperture;
a tilting deflector which deflects the ion beam passed through the aperture;

a beam scanner which scans the ion beam passed through the tilting deflector; and an objective lens which is a second electrostatic lens, and which irradiates the ion beam passed through the beam scanner on a sample, wherein the ion beam has no intermediate convergence point between the objective lens and the condenser lens during processing with a vertical beam or observing with the vertical beam, the method comprising, if a tilted beam is selected, causing:

the ion beam to have the intermediate convergence point;

the aperture to be moved out of an optical axis;

the tilting deflector to deflect the ion beam in the same direction as the aperture is moved;

the ion beam to pass through the objective lens out of the optical axis; and the ion beam tilted to the optical axis to be irradiated on the sample.

13. The processing observation method of a sample according to claim 12, wherein when a combination of a condenser lens voltage, an aperture position, a tilting deflector voltage, an objective lens voltage, and a beam scanner voltage is changed, a tilt of the ion beam to the optical axis is changed.

14. The processing observation method of a sample according to claim 12, wherein a direction or/and incidence angle of the ion beam tilted to the optical axis are displayed on a display device of the focused ion beam apparatus.

15. The processing observation method of a sample according to claim 12, wherein the intermediate convergence point is set in an interior portion of the tilting deflector.

16. The processing observation method of a sample according to claim 12, wherein the ion beam tilted to the optical axis is irradiated on a sample and a thin film having a nearly uniform film thickness is prepared.

17. The processing observation method of a sample according to claim 12, wherein the ion beam tilted to the optical axis is irradiated on a sample and a cross section image from a secondary particle signal generated along with a cross section processing of the sample is formed.

18. The processing observation method of a sample according to claim 17, wherein in the case where the formed cross section image satisfies a predetermined condition, the cross section processing is finished.

19. The processing observation method of a sample according to claim 17, wherein in the case where the formed cross section image satisfies a predetermined condition, a processing condition is changed.

20. The processing observation method of a sample according to claim 12, wherein the ion beam tilted to the optical axis is irradiated on a sample and a pillar sample having the nearly same tilt as that of a side surface of the sample is prepared.

21. The processing observation method of a sample according to claim 12, wherein the ion beam tilted to the optical axis is irradiated on a micro-sample, and the micro-sample and a fixed object are fixed by using a deposition film.

22. The processing observation method of a sample according to claim 12, wherein while changing a tilt angle of the ion beam to the optical axis, the ion beam is irradiated on a sample and a cross section is prepared on the sample.

* * * * *